(12) United States Patent
Figueroa et al.

(10) Patent No.: US 6,556,453 B2
(45) Date of Patent: Apr. 29, 2003

(54) ELECTRONIC CIRCUIT HOUSING WITH TRENCH VIAS AND METHOD OF FABRICATION THEREFOR

(75) Inventors: David G. Figueroa, Mesa, AZ (US); Nicholas R. Watts, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/735,956

(22) Filed: Dec. 13, 2000

(65) Prior Publication Data

US 2002/0071256 A1 Jun. 13, 2002

(51) Int. Cl.[7] .................................................. H05K 1/18
(52) U.S. Cl. .................... 361/763; 361/760; 361/761; 361/762; 361/764; 361/766; 361/811; 174/260; 174/261
(58) Field of Search ................................. 361/763, 766, 361/811, 760, 761, 762, 764; 174/260, 261

(56) References Cited

U.S. PATENT DOCUMENTS 5,607,883 A * 3/1997 Bhattacharyya et al. .... 437/209
6,075,285 A 6/2000 Taylor et al. ................ 257/691

OTHER PUBLICATIONS

Cotton, M., "Microfeatures & Embedded Coaxial Technology", *Electronic Circuits World Convention 8*, 6 pgs., (Sep. 8, 1999).

* cited by examiner

*Primary Examiner*—David Martin
*Assistant Examiner*—Thanh Y. Tran
(74) *Attorney, Agent, or Firm*—Schwegman, Lundberg, Woessner & Kluth, P.A.

(57) ABSTRACT

An electronic circuit package (400, FIG. 4) includes one or more trench vias (404, FIG. 4). Each trench via makes electrical contact with one or more terminals (526, FIG. 5) of a discrete device (520, FIG. 5) embedded within the package. A trench via can extend to a surface of the package, or one or more conventional vias (620, FIG. 6) formed within layers (602, FIG. 6) above or below the trench via can electrically connect the trench via, and thus the discrete device, to the surface of the package. The discrete device (520, FIG. 5) can be a capacitor, in one embodiment, providing decoupling capacitance to an integrated circuit load. Besides being implemented in a package, the trench vias also could be implemented in other types of electronic circuit housings (e.g., interposers, sockets, and printed circuit boards).

29 Claims, 7 Drawing Sheets

ELECTRONIC CIRCUIT HOUSING WITH TRENCH VIAS AND METHOD OF FABRICATION THEREFOR

TECHNICAL FIELD OF THE INVENTION

The present invention relates generally to electronic circuit housings (e.g., packages, interposers, sockets, and printed circuit boards), and more particularly, to housings having embedded discrete devices, and methods of fabrication therefor.

BACKGROUND OF THE INVENTION

Electronic circuits, and particularly computer and instrumentation circuits, have in recent years become increasingly powerful and fast. As circuit frequencies continue to escalate, with their associated high frequency transients, noise in the power and ground lines increasingly becomes a problem. This noise can arise due to inductive and capacitive parasitics, for example, as is well known. To reduce such noise, capacitors known as decoupling capacitors are often used to provide a stable signal or stable supply of power to the circuitry.

Capacitors are further utilized to dampen voltage overshoot when an electronic device (e.g., a processor) is powered down, and to dampen voltage droop when the device powers up. For example, a processor that begins performing a calculation may rapidly need more current than can be supplied by the on-chip capacitance. In order to provide such current and to dampen the voltage droop associated with the increased load, off-chip capacitance should be available to respond to the current need within a sufficient amount of time. If insufficient current is available to the processor, or if the response time of the capacitance is too slow, the die voltage may collapse to a level that affects the processor's performance. The localized portions of a die that require large amounts of current in short periods of time are often referred to as die "hot spots."

Decoupling capacitors and capacitors for dampening voltage overshoot or droop are generally placed as close as practical to a die load or hot spot in order to increase the capacitors' effectiveness. Often, the decoupling capacitors are surface mounted to the die side or land side of the package upon which the die is mounted. FIG. 1 illustrates a cross-section of an integrated circuit package 102 having die side capacitors 106 and land side capacitors 108 in accordance with the prior art. Die side capacitors 106, as their name implies, are mounted on the same side of the package as the integrated circuit die 104. In contrast, land side capacitors 108 are mounted on the opposite side of the package 102 as the die 104.

FIG. 2 illustrates an electrical circuit that simulates the electrical characteristics of the capacitors illustrated in FIG. 1. The circuit shows a die load 202, which may require capacitance or noise dampening in order to function properly. Some of the capacitance can be supplied by capacitance located on the die, as modeled by capacitor 204. Other capacitance, however, must be provided off chip, as modeled by off-chip capacitor 206. The off-chip capacitor 206 could be, for example, the die side capacitors 106 and/or land side capacitors 108 illustrated in FIG. 1. The off-chip capacitor 206 may more accurately be modeled as a capacitor in series with some resistance and inductance. For ease of illustration, however, off-chip capacitor 206 is modeled as a simple capacitor.

Naturally, the off-chip capacitor 206 would be located some distance, however small, from the die load 202, due to manufacturing constraints. Accordingly, some inductance, as modeled by inductor 208, exists between the die load and the off-chip capacitor 206. The value of inductor 208 is related to the "loop area," which is the distance from die load 202, through capacitor 206, and back to die load 202.

Because the inductor 208 tends to slow the response time of the off-chip capacitor 206, it is desirable to minimize the loop area, thus reducing the value of inductor 208. This can be achieved, in part, by placing the off-chip capacitor 206 as electrically close as possible to the die load.

Referring back to FIG. 1, die side capacitors 106 are mounted around the perimeter of the die 104, and provide capacitance to various points on the die through traces, vias, and planes (not shown) in the package 102. Because die side capacitors 106 are mounted around the perimeter of the die, the path length between a hot spot and a capacitor 106 may result in a relatively high inductance feature between the hot spot and the capacitor 106.

In contrast, land side capacitors 108 can be mounted directly below die 104, and thus directly below some die hot spots. Thus, in some cases, land side capacitors 108 can be placed electrically closer to the die hot spots than can die side capacitors 106, resulting in a smaller loop area, and a lower inductance path to between the die hot spot and the capacitor 108. However, the package also includes connectors (not shown), such as pins or lands, located on its land side. In some cases, placement of land side capacitors 108 on the package's land side would interfere with these connectors. Thus, the use of land side capacitors 108 is not always an acceptable solution to the inductance problem. In addition, in some cases, the thickness of the package could make the loop area unacceptably large.

Besides the inductance issues described above, additional issues are raised by the industry's trend to continuously reduce device sizes and packing densities. Because of this trend, the amount of package real estate available to surface-mounted capacitors is becoming smaller and smaller.

As electronic devices continue to advance, there is an increasing need for higher levels of capacitance at reduced inductance levels for decoupling, voltage dampening, and supplying charge. In addition, there is a need for capacitance solutions that do not interfere with package connectors, and which do not limit the industry to certain device sizes and packing densities. Accordingly, there is a need in the art for alternative capacitance solutions in the fabrication and operation of electronic devices and their packages.

DETAILED DESCRIPTION OF THE INVENTION

Various embodiments of the present invention provide an electronic housing (e.g., an integrated circuit package, interposer, socket or printed circuit (PC) board) that includes trench vias, which are conductive vias having a length that is at least twice the width of the via. The trench vias form electrical connections to one or more terminals of a discrete device embedded within the housing. These trench vias can be exposed to the top surface of the housing, or they can be buried within the housing and electrically connected to the top or other surface of the housing using conventional vias that contact the trench vias.

The use of trench vias to electrically connect with a discrete device embedded within a housing provides several advantages. First, a trench via can provide a substantially more reliable connection to the device than may be possible using conventional vias alone. This is particularly true when multiple conventional vias connect to each trench via. In the event that one or more of these conventional vias fails (e.g., due to high currents), other conventional vias are still available to carry current to and from the device. Reliable connection to an embedded device is important to ensure that the inductance between the device and its load remains consistent from package to package and over time.

Another benefit to using trench vias is that they can provide more current carrying capacity to the embedded device than might be possible using conventional vias. A single conventional via that contacts an embedded device's terminal has a current carrying capacity that is limited by the via's cross sectional area. In contrast, multiple conventional vias can electrically connect to each trench via, thus multiplying the amount of current that can be carried to the trench via and to the embedded device.

Still another benefit to using trench vias, which is alluded to above, is that the inductance and resistance between the embedded device and the load can be reduced. This is because more connections (e.g., vias) can exist between the device and the load, due to the ability to connect multiple conventional vias to each trench via. In addition, because the device is embedded within the package, the loop area, and thus the inductance, may be smaller than with surface mounted devices.

Figure 1:
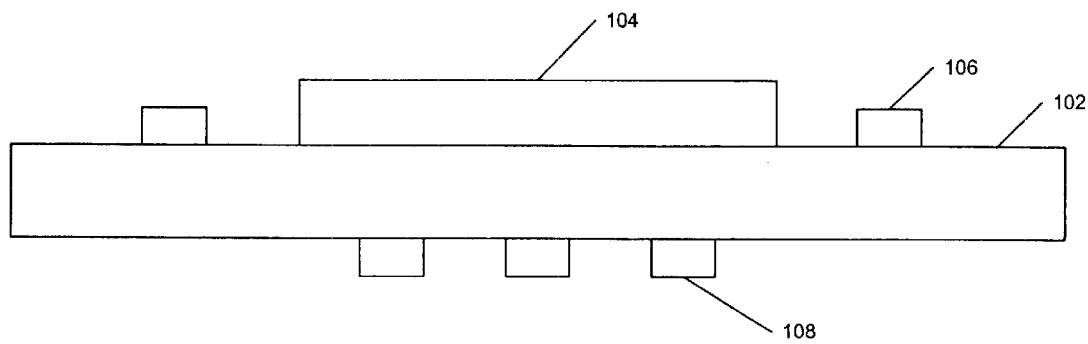
FIG. 1 illustrates a cross-section of an integrated circuit package having die side and side capacitors in accordance with the prior art.
Figure 2:
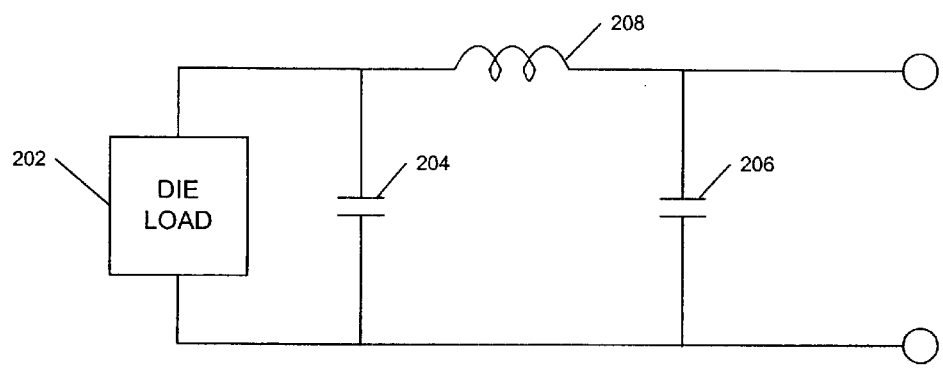
FIG. 2 illustrates an electrical circuit that simulates the electrical characteristics of the capacitors illustrated in FIG. 1.
Figure 3:
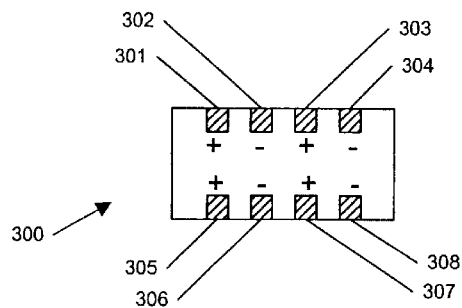
FIG. 3 illustrates a top view of an eight terminal discrete capacitor.

FIG. 3 illustrates a top view of an eight terminal discrete capacitor 300. Capacitor 300 is intended as an example of a type of device that could be embedded within an integrated circuit package, interposer, socket, and/or PC board.

Capacitor 300 includes eight terminals 301–308, which provide electrical connections to positive and negative leads of a capacitive structure (not shown) within capacitor 300. On each side of capacitor 300, the polarity of terminals 301–308 alternates between positive and negative, in one embodiment. In addition, opposing terminals have the same polarity. Thus, as in the example shown, terminals 301 and 305 have a positive polarity, terminals 302 and 306 have a negative polarity, terminals 303 and 307 have a positive polarity, and terminals 304 and 308 have a negative polarity. As will be explained in more detail, below, this allows an electrically conductive trench via to be established across each of the opposing terminal pairs, where the trench via will connect the opposing terminals to power or ground, depending on their polarity.

Although capacitor 300 is shown to have eight terminals 301–308 on two opposite sides of capacitor 300, a device used in accordance with the various embodiments could have more or fewer terminals, and those terminals could be located on more or fewer sides of the device. For example, the device could be a two terminal device, with side terminals that extend the length of the device. In such a case, a trench via could be used to contact each of the terminals along the length of the terminal, rather than contacting two or more separate terminals. In addition, the device's terminals could be on 1, 2, 3, 4 or more sides, and trench vias could be used to connect to some or all of these terminals, as will be described in more detail below.

In various embodiments, capacitor 300 could be a ceramic capacitor, aluminum oxide capacitor, or a capacitor made with virtually any other embeddable technology, as would be obvious to one of skill in the art based on the description herein. The dimensions of capacitor 300 could vary widely, depending on design and manufacturing constraints or other factors. For example, capacitor 300 could be a standard size, such as approximately 80×50 mils or 60×120 mils. Alternatively, capacitor 300 could have larger and/or smaller dimensions. In addition, capacitor 300 need not necessarily be rectangular in shape, as it could assume a number of different shapes (e.g., square, circular, or multi-sided).

FIG. 3 is intended to show a single type of discrete capacitor that could be used in conjunction with various embodiments of the present invention. This example is not intended to be limiting in any sense, as one of skill in the art would understand, based on the description herein, that numerous different types of discrete capacitors or other discrete devices could be used. Specifically, capacitors or other devices having more or fewer terminals and having different shapes and relative sizes could be used.

Figure 4:
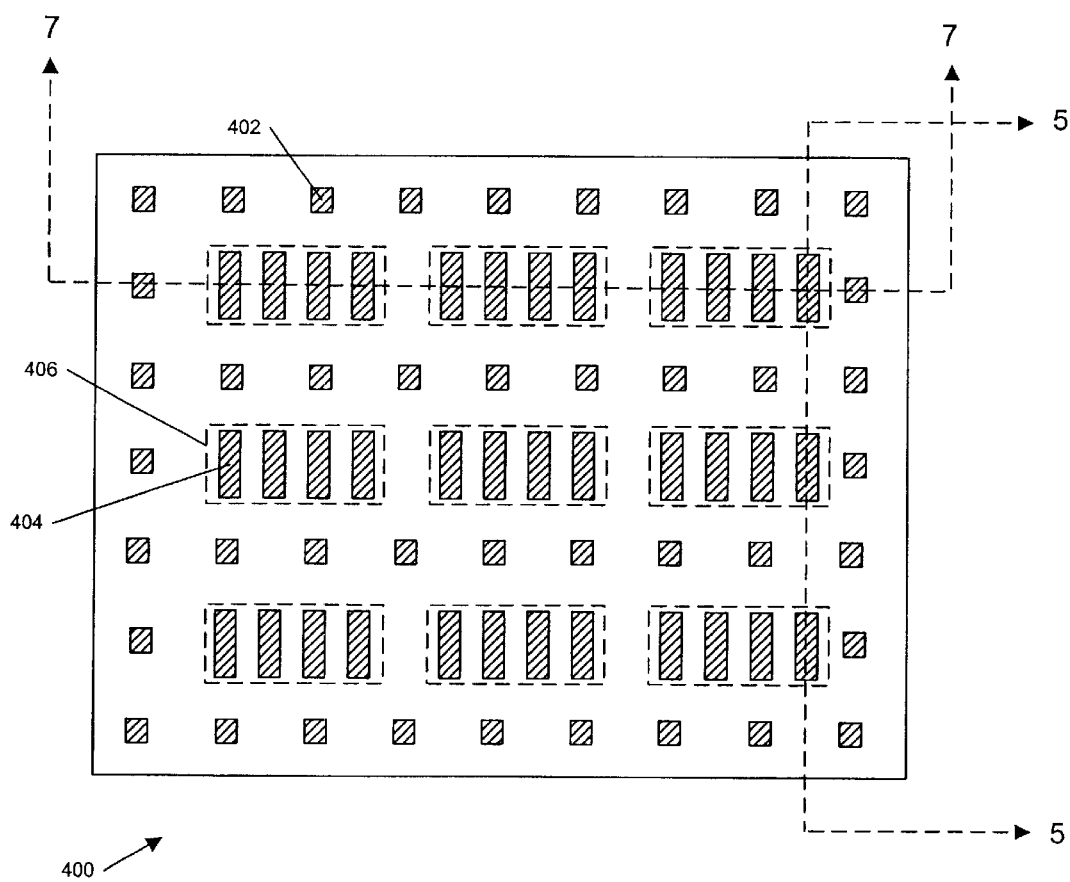
FIG. 4 illustrates a top view of an electronic package including a set of trench vias in accordance with one embodiment of the present invention.

FIG. 4 illustrates a top view of an electronic package 400 including a set of trench vias 404 in accordance with one embodiment of the present invention. In one embodiment, package 400 includes multiple, conductive bonding pads 402 on its top surface, which are electrically connectable to complementary pads on an integrated circuit (not shown). Some or all of pads 402 are electrically connected to vias (not shown), which in turn connect various layers of package 400 with the top surface.

Package 400 also includes one or more conductive trench vias 404, which are electrically connectable to one or more discrete devices 406 (e.g., capacitors) embedded within package 400. In one embodiment, trench vias 404 are located on the top surface of package 400. In another embodiment, one or more of trench vias 404 are located in package layers below the top surface, and trench vias 404 are electrically connected to the top surface through conventional vias (not shown).

The figure shows four trench vias 404 located substantially over each of the discrete devices 406, and extending across a width of each of the devices 406. In one embodiment, discrete devices 406 are embedded capacitors having terminals on opposite sides of the capacitor, and each trench via 404 makes electrical contact with at least one of the terminals. When a trench via is connected to multiple terminals of a device, those terminals should have the same polarity or should be dedicated to the same signal.

Referring also to FIG. 3, if each discrete device 406 is a capacitor (e.g., capacitor 300, FIG. 3), then one of the four trench vias 404 would make contact with terminals 301 and 305, a second via 404 would make contact with terminals 302 and 306, a third via 404 would make contact with terminals 303 and 307, and a fourth via 404 would make contact with terminals 304 and 308, in one embodiment. When electrically connected to a load, the first and third vias 404 could be connected to power, and the second and fourth vias 404 could be connected to ground, or vice versa.

In alternate embodiments, more or fewer trench vias 404 could connect to each embedded device 406. Also, although FIG. 4 shows the trench vias 404 being oriented in a parallel pattern to each other, the vias could be oriented in a different manner. In addition, FIG. 4 illustrates trench vias 404 having a top view with roughly rectangular shapes. In other embodiments, the top view of the trench via could have rounded corners and/or other shapes (e.g., a parallelogram). Finally, the number of discrete devices 406 is for illustration purposes only, and more or fewer devices could be embedded within package 400. Various cross sectional views of the package illustrated in FIG. 4 will now be described.

Figure 5:
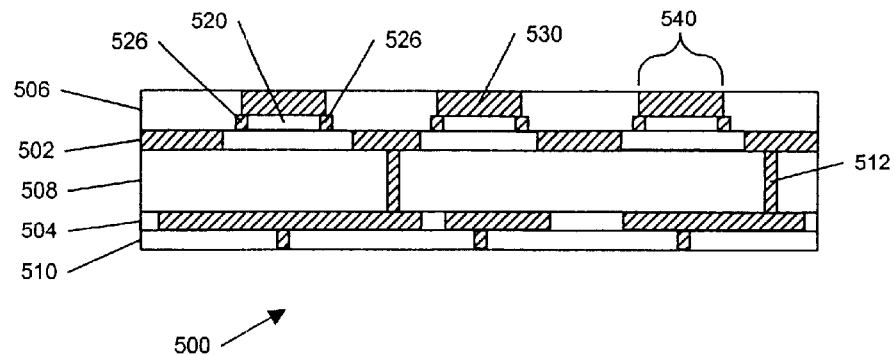
FIG. 5 illustrates a cross section of the electronic package shown in FIG. 4 along section lines 5—5.

FIG. 5 illustrates a cross section of the electronic package shown in FIG. 4 along section lines 5—5. Package 500 includes one or more layers 502, 504 of patterned material separated by one or more layers 506, 508, 510 of dielectric material. Conventional vias 512, which are generally circular in cross section, are used to interconnect the various conductive layers 502, 504. Conventional vias 512 could have non-circular cross sectional shapes as well.

Embedded within at least one of the layers are one or more discrete devices 520, each having two or more terminals 526. One or more of the terminals 526 could be insulated from or make electrical contact with a patterned conductive material layer 502, 504.

Trench vias 530 are located substantially over each of the devices 520. In the example shown, each trench via 530 has a length 540 that enables the via to make electrical contact with at least one of the terminals 526. A benefit of using trench vias 530 is that it enables more current to be delivered to each terminal 526 of the device 520 than is possible using only a single conventional via in contact with each terminal of the device.

The length 540 of each trench via 530 depends on the distance between the terminals that each trench via interconnects. Because these distances can vary widely, depending on the device, the length of the trench via also can vary widely. In addition, the height of each trench via 530 depends on the distance between the top surface of the discrete device and the top surface of the layer within which the trench via exists. Thus, the height of each trench via 530 also can vary widely.

Although each trench via 530 is shown connecting to two opposing terminals 526 of a discrete device 520, each trench via could be used to connect to as few as one terminal or to several terminals, and those terminals need not necessarily oppose each other (e.g., they could be located next to each other on the same side of the capacitor). It is to be understood that the number of terminals on the discrete device can be different from the number of trench vias used to electrically connect the discrete device to the die.

Trench vias 530 extend to the top surface of package 500, in the embodiment shown. Accordingly, electrical connections to trench vias 530 can be made directly, or can be made through patterned conductive material (not shown) deposited on the top surface. Alternatively, trench vias 530 could be located below the top surface, and conventional vias or other trench vias could be used to electrically connect trench vias 530 to other layers and/or to the top surface of package 500.

Figure 6:
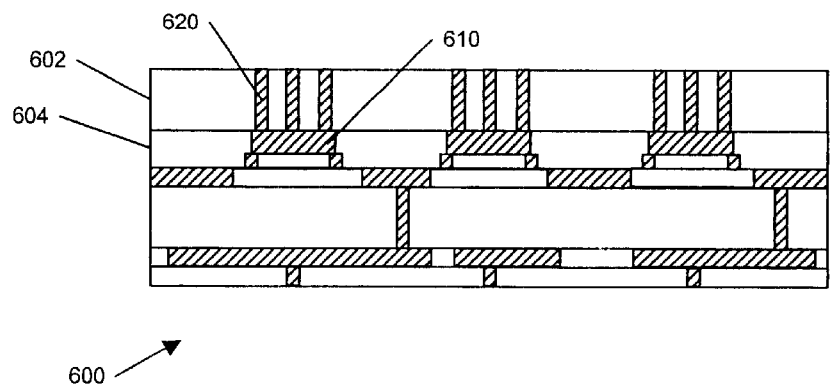
FIG. 6 illustrates a cross section of the electronic package shown in FIG. 5 with additional package layers in accordance with another embodiment of the present invention.

FIG. 6 illustrates a cross section of the electronic package shown in FIG. 5 with one or more additional package layers in accordance with another embodiment of the present invention. The additional layers 602 are located above a layer 604 that includes trench vias 610. Electrical connections between trench vias 610 and the top surface off the package 600 are made using one or more vias 620 that extend to each trench via 610. These conventional vias 620 could have diameters in a range of 50–300 microns, although vias having larger or smaller diameters could be used as well. In addition, conventional vias 620 could electrically connect trench vias 610 to the top surface of package 600, or they could connect trench vias 610 to one or more other layers of package 600.

In one embodiment, the length of trench vias 610 is greater than the diameter of each conventional via 620. Accordingly, it is possible to connect multiple conventional vias 620 to each trench via 610. A benefit of using multiple conventional vias 620 to connect with each trench via 610 is that more current can be supplied to each trench via 610, and thus each terminal of the discrete device, than is possible using only a single conventional via in contact with each terminal of the device. Although FIG. 6 shows three conventional vias 620 connected to each trench via 610, more or fewer conventional vias 620 could be connected to each trench via 610 in alternate embodiments.

Figure 7:
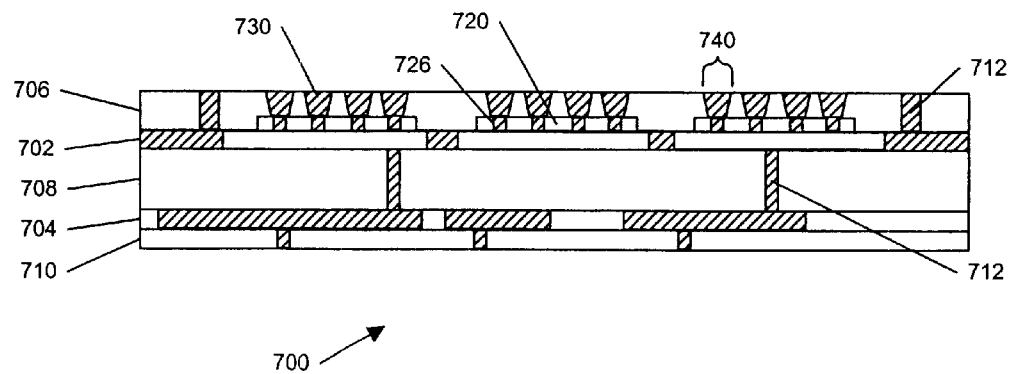
FIG. 7 illustrates a cross section of an electronic package shown in FIG. 4 along section lines 7—7.

FIG. 7 illustrates a cross section of an electronic package shown in FIG. 4 along section lines 7—7. As with the packages described in conjunction with FIGS. 5 and 6, package 700 includes one or more layers 702, 704 of patterned conductive material, one or more layers 706, 708, 710 of dielectric material, and conventional vias 712.

Embedded within at least one of the layers are one or more discrete devices 720, each having two or more terminals 726. One or more of the terminals 726 could be insulated from or make electrical contact with a patterned conductive material layer 702, 704.

Trench vias 730 are located substantially over each of the devices 720. A width 740 of each trench via 730 can be as narrow as a width of a conventional via, although it also can be wider or narrower. The width 740 of each trench via should be chosen to maximize an amount of conductive material that makes contact with the terminals of the discrete device without shorting to adjacent vias, although the width could be larger or smaller as well. In one embodiment, a "trench via" is defined as a via having a length (e.g., length 540, FIG. 5) that is at least twice the width 740 of the via.

The cross sectional shape of each trench via 730 can be rectangular, square or trapezoidal, as is illustrated in FIG. 7. In alternate embodiments, the shape of each trench via 730 could be different.

In the embodiments shown in FIGS. 5–7, discrete devices and trench vias are shown at only one layer of the package. In other embodiments, the devices and trench vias could be located on other and/or multiple layers of the package. In addition, the number of package layers, discrete devices, trench vias, and conventional vias could be different than shown in the Figures, and could be arranged in different configurations, as would be obvious to one of skill in the art based on the description herein.

Figure 8:
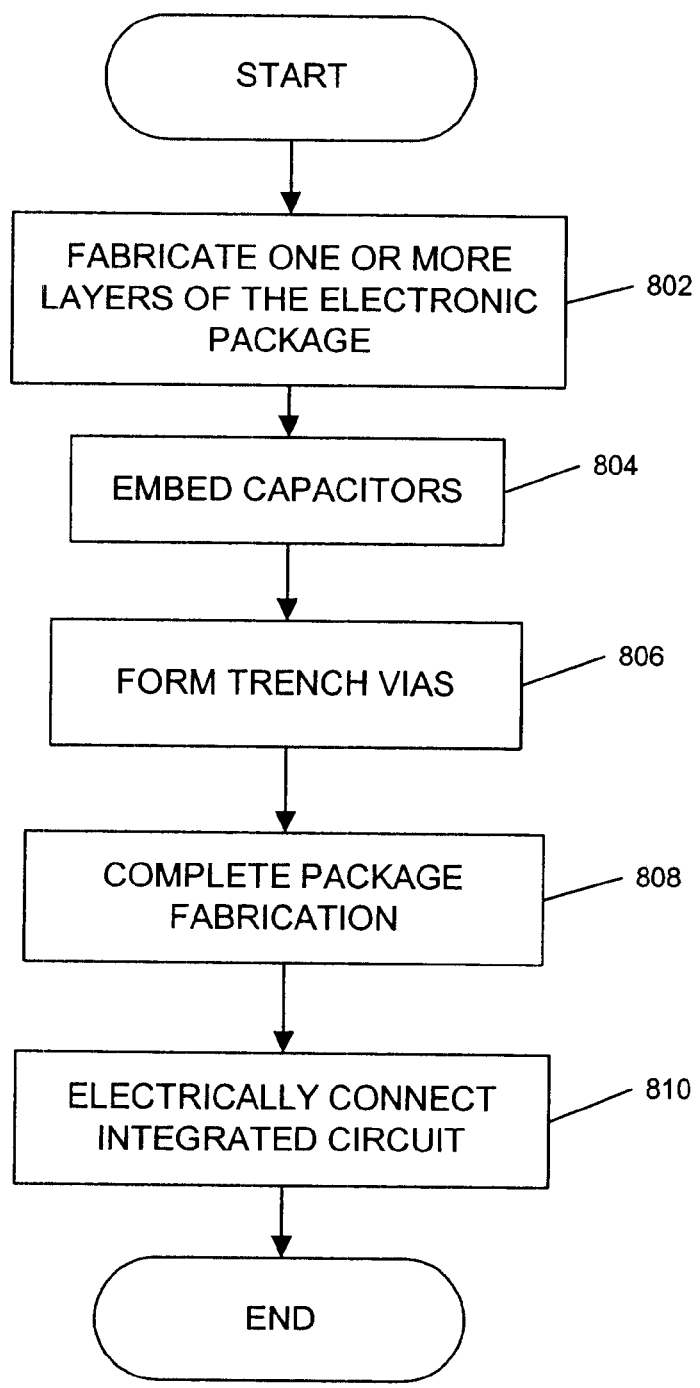
FIG. 8 illustrates a flowchart of a method for fabricating an electronic package including trench vias in accordance with one embodiment of the present invention.

FIG. 8 illustrates a flowchart of a method for fabricating an electronic package including trench vias in accordance with one embodiment of the present invention. FIG. 8 should be viewed in conjunction with FIGS. 9–13, which are schematic cross sections illustrating various stages of fabricating an electronic package including trench vias in accordance with one embodiment of the present invention.

The method begins, in block 802, by fabricating one or more layers (902, 904, 906, 908, 910, FIG. 9) of the electronic package. The layers can be fabricated using standard techniques known to those of skill in the art.

Generally, the process begins by providing a substrate, which can be an organic substrate, such as an epoxy material, in one embodiment. For example, standard PC board materials such as FR-4 epoxy-glass, polymide-glass, benzocyclobutene, Teflon, other epoxy resins, injection molded plastic or the like could be used in various embodiments. In alternate embodiments, the substrate could consist of an inorganic substance, such as ceramic, for example.

Figure 9:
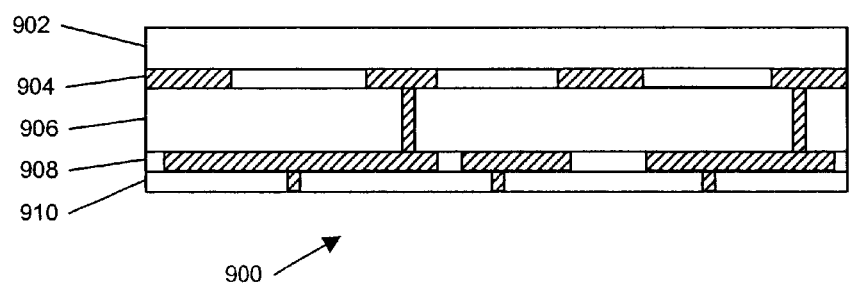
FIGS. 9–13 are schematic cross sections illustrating various stages of fabricating an electronic package including trench vias in accordance with one embodiment of the present invention.

Standard procedures for building up levels of conductive or insulating layers can then be employed using techniques known to those of skill in the art, thus creating a single or multiple layer structure 900 (FIG. 9). These techniques can include, for example, any combination of photolithography, material deposition, plating, drilling, printing, lamination, and other processes for selectively adding or removing conductive and non-conductive materials.

In various embodiments, the thickness of structure 900 is within a range of about 10–1000 microns. Structure 900 could consist of one or multiple layers of dielectric material and patterned conductive material, where each layer is within a range of about 10–40 microns in one embodiment. The substrate and its associated layers could be thicker or thinner than these ranges in other embodiments.

Figure 10:
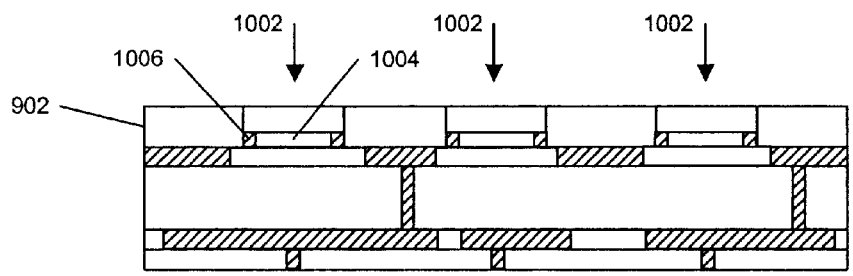

In block 804, one or more capacitors (1004, FIG. 10) or other discrete devices are embedded within one or more layers (e.g., layer 902, FIGS. 9 and 10). This is accomplished by forming one or more cavities 1002 (FIG. 10) in a top surface of the package, placing the discrete device 1004 within the cavities 1002, and filling the cavities 1002 above the discrete device 1004 with a non-conductive material.

Formation of the cavities 1002 could be performed, for example, by laser or mechanical drilling, or by using a common subtractive technology, such as chemical mechanical planarization to physically abrade away the material. Alternatively, a photo or laser imaging and etching process could be used. Other subtractive technologies could be used in other embodiments.

In still other embodiments, the cavities 1002 could be formed during the build-up process, by not applying material in the areas where the cavities are to exist. In other words, rather than forming and selectively removing portions of the layer, cavities 1002 could be formed by selectively adding the desired portions of the conducting and/or non-conducting layers.

If the layer 902 within which the discrete device is embedded is an inorganic substance, such as ceramic, other cavity formation techniques known to those of skill in the art would be used. For example, layer 902 could be created with cavities 1002 already existing therein. Alternatively, the cavities 1002 could be punched into layer 902 before it is added to the package.

After the cavities 1002 have been formed, discrete capacitors 1004 or other devices are inserted into the cavities, and a non-conductive material is deposited over the devices. The relative dimensions of each cavity 1002 will vary depending on the size of the capacitor or other device that will be inserted into cavity 1002. Essentially, each cavity 1002 must be large enough to accommodate the capacitor or other device. In one embodiment, a single device is fitted within each cavity 1002. In an alternate embodiment, one or more of the cavities 1002 could be large enough to hold two or more capacitors or discrete devices.

Figure 11:
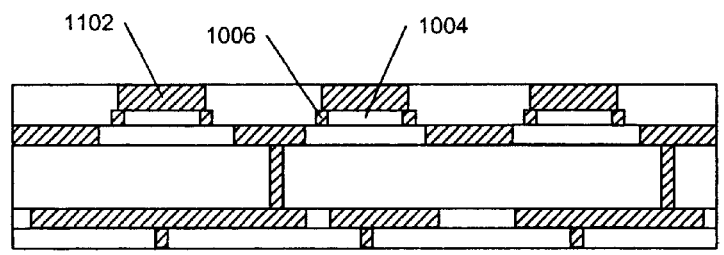

Referring back to FIG. 8, in block 806, one or more trench vias (1102, FIG. 11) are formed substantially over capacitors (1004, FIGS. 10 and 11), where each trench via 1102 makes electrical contact with one or more of the capacitor's terminals (1006, FIGS. 10 and 11). Trench vias 1102 are formed, in one embodiment, by forming openings in the material above the capacitors 1004, and depositing a conductive material in the openings.

Formation of the trench via openings could be performed, for example, by laser or mechanical drilling, or by using a common subtractive technology, such as chemical mechanical planarization to physically abrade away the material. Alternatively, a photo or laser imaging and etching process could be used. Other subtractive technologies could be used in other embodiments.

If the layer 902 within which the discrete device is embedded is an inorganic substance, such as ceramic, other opening formation techniques known to those of skill in the art would be used. For example, layer 902 could be created with the trench via openings already existing therein. Alternatively, the trench via openings could be punched into layer 902 before it is added to the package.

Conductive material is deposited in the trench via openings by plating, material deposition or printing. In one embodiment, the conductive material is copper, although other conductive materials such as tin, lead, nickel, gold, palladium, or other materials could be used in other embodiments.

Referring back to FIG. 8, in block 808, the fabrication of the package is completed. This involves the formation of one or more additional layers (1202, FIG. 12) above the layer that includes the trench vias (1102, FIGS. 11 and 12), in one embodiment, although trench vias 1102 could exist in a top layer of the package, as well.

In one embodiment, one or more conventional vias 1204 (FIG. 12) are formed in the additional layers 1202. Some of these vias 1204 make electrical contact with the trench vias 1102, thus allowing current to flow through the conventional vias 1204 and to the trench vias 1102. In one embodiment, multiple conventional vias 1204 contact each trench via 1102, although a single via could be used to contact each trench via 1102 as well. In an alternate embodiment, another trench via (not shown) could be formed in layer 1202 to electrically contact each trench via 1102.

Formation of conventional vias 1204 can be performed using techniques well known to those of skill in the art. In one embodiment, vias 1204 are laser or mechanically drilled and plated or filled with a conductive material, although vias 1204 may also be punched or formed using other techniques in various embodiments.

Figure 12:
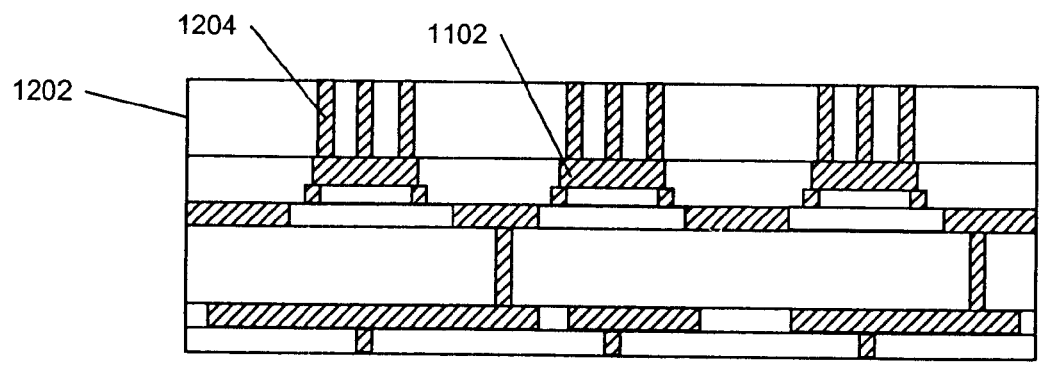
Figure 13:
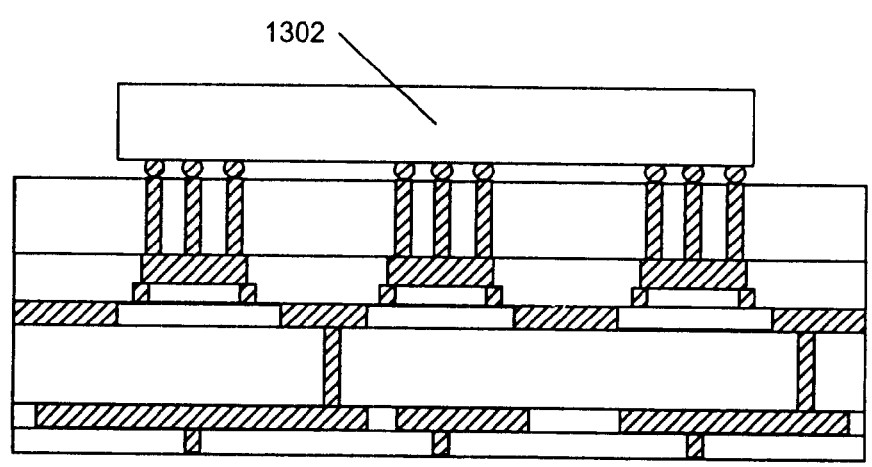

Although only a single additional layer 1202 is shown in FIG. 12, it would be obvious to one of skill in the art based on the description herein that multiple additional layers could exist between the discrete devices and the top surface of the package. In addition, each conventional via 1204 could extend directly from the top of the package, as is shown in FIG. 12, or could include several via segments that are aligned or staggered, through several additional layers.

Referring back to FIG. 8, an integrated circuit (1302, FIG. 13) is electrically connected to landing pads on the top surface of the package, in block 810. Integrated circuit 1302 can be connected, for example, by depositing solder bumps on the package's landing pads, and/or on pads on integrated circuit 1302, and reflowing the solder once the integrated circuit 1302 is arranged over the corresponding landing pads on the package. Alternatively, the integrated circuit 1302 could be connected to the package using wire bond or other technologies known to those of skill in the art. The method then ends.

While FIGS. 8–13 discuss fabricating an electronic package with trench vias, the methods also could be applied to fabricating other types of electronic housings (e.g., interposers, sockets or PC boards) with trench vias. As would be obvious to one of skill in the art based on the description herein, the methods described above would be varied depending on the particular fabrication technologies used.

Figure 14:
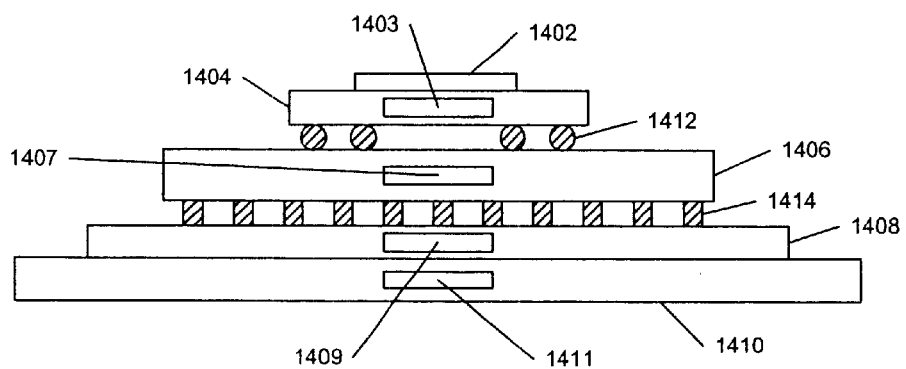
FIG. 14 illustrates an integrated circuit package, interposer, socket, and printed circuit board, each of which could include one or more embedded devices in accordance with various embodiments of the present invention.

As described previously, trench vias (e.g., vias 404, 530, 610, 730, FIGS. 4–7), which provide electrical connections to embedded discrete devices, can be included within an integrated circuit package, interposer, socket, and/or PC board. FIG. 14 illustrates an integrated circuit package 1404, interposer 1406, socket 1408, and PC board 1410, each of which could include one or more embedded devices and trench vias in accordance with various embodiments of the present invention.

Starting from the top of FIG. 14, an integrated circuit 1402 is housed by integrated circuit package 1404. Integrated circuit 1402 contains one or more circuits, which are electrically connected to integrated circuit package 1404 by connectors (not shown).

Integrated circuit 1402 could be any of a number of types of integrated circuits. In one embodiment of the present invention, integrated circuit 1402 is a microprocessor, although integrated circuit 1402 could be other types of devices in other embodiments. In the example shown, integrated circuit 1402 is a "flip chip" type of integrated circuit, meaning that the input/output terminations on the chip can occur at any point on its surface. After the chip has been readied for attachment to integrated circuit package 1404, it is flipped over and attached, via solder bumps or balls to matching pads on the top surface of integrated circuit package 1404. Alternatively, integrated circuit 1402 could be wire bonded, where input/output terminations are connected to integrated circuit package 1404 using bond wires to pads on the top surface of integrated circuit package 1404.

One or more of the circuits within integrated circuit 1402 acts as a load, which may require capacitance, noise suppression, and/or voltage dampening. Some of this capacitance is provided, in one embodiment of the present invention, by capacitors 1403 embedded within package 1404. These capacitors 1403 are electrically connected to the integrated circuit loads, at least in part, using one or more trench vias, as described above. In this manner, one or more levels of additional capacitance are provided to integrated circuit 1402, also providing voltage dampening and noise suppression, when needed. The close proximity of these off-chip sources of capacitance means that each source has a relatively low inductance path to the die.

In other embodiments, the capacitors 1407, 1409, 1411 and trench vias are embedded within interposer 1406, socket 1408, PC board 1410 or some combination thereof. Integrated circuit package 1404 is coupled to interposer 1406 using solder connections, such as ball grid array connections 1412, for example. In another embodiment, integrated circuit package 1404 could be electrically and physically connected to interposer 1406 using a pinned or other type of connection.

Interposer 1406 is coupled to PC board 1410 through a socket 1408 on PC board 1410. In the example shown, interposer 1406 includes pins 1414, which mate with complementary pin holes in socket 1408. Alternatively, interposer 1406 could be electrically and physically connected to PC board 1410 using solder connections, such as ball grid array connections, for example. In still another alternate embodiment, integrated circuit package 1404 could be connected directly to socket 1408 and/or PC board 1410, without using an interposer. In such an embodiment, integrated circuit package 1404 and PC board 1410 could be electrically and physically connected using ball grid array or pinned connections. Other ways of connecting integrated circuit package 1404 and PC board 1410 could also be used in other embodiments.

Printed circuit board 1410 could be, for example, a motherboard of a computer system. As such, it acts as a vehicle to supply power, ground, and signals to integrated circuit 1402. These power, ground, and other signals are supplied through traces or planes (not shown) on or within PC board 1410, socket 1408, pins 1414, interposer 1406, and integrated circuit package 1404.

Figure 15:
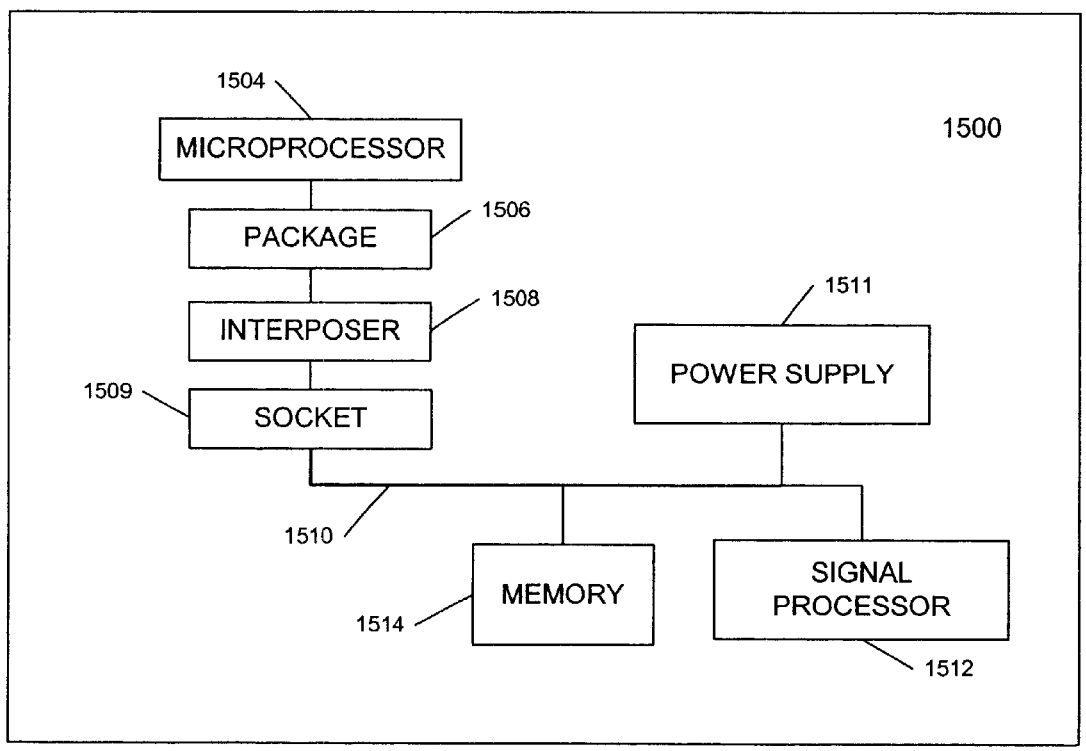
FIG. 15 illustrates a general-purpose computer system in accordance with one embodiment of the present invention.

The configuration described above in conjunction with various embodiments could form part of a general purpose computer system. FIG. 15 illustrates a general purpose computer system 1500 in accordance with one embodiment of the present invention.

The computer system is housed on one or more PC boards, and includes microprocessor 1504, integrated circuit package 1506, interposer 1508, socket 1509, bus 1510, power supply 1511, signal processor 1512, and memory 1514. Integrated circuit package 1506, interposer 1508, socket 1509, and/or the PC board include one or more capacitors or other devices that are embedded within them and electrically connected using one or more trench vias, in accordance with various embodiments of the present invention. Integrated circuit package 1506, interposer 1508, and socket 1509 couple microprocessor 1504 to bus 1510 in order to deliver power and communication signals between microprocessor 1504 and devices coupled to bus 1510. In one embodiment, bus 1510 couples microprocessor 1504 to memory 1514, power supply 1511, and signal processor 1512. However, it is to be understood that in alternative embodiments of the present invention, microprocessor 1504 can be coupled to memory 1514, power supply 1511, and signal processor 1512 through different busses.

Conclusion

Various embodiments of a package structure and methods of fabricating that structure have been described, along with a description of the incorporation of the structure within a general-purpose computer system. The description specifically refers to embedding a capacitor in an integrated circuit package and establishing trench vias to make electrical contact with the capacitor's terminals. The method and apparatus of the various embodiments also could be used to make electrical contact with a capacitor embedded within a different type of housing (e.g., an interposer, socket, or PC board). Also, trench vias could be established on a top or bottom surface of a housing, and the capacitor could be mounted on the surface, making electrical contact with the trench vias as described above. In addition, the various embodiments of the present invention could be applied to embedding other discrete devices (e.g., inductors, resistors, transistors, etc.) within a housing, and making electrical connection to those devices using trench vias.

While the foregoing examples of dimensions and ranges are considered typical, the various embodiments of the invention are not limited to such dimensions or ranges. It is recognized that the trend within industry is to generally reduce device dimensions for the associated cost and performance benefits.

In the foregoing detailed description of the preferred embodiments, reference is made to the accompanying drawings, which form a part hereof, and in which are shown by way of illustration specific preferred embodiments in which the invention may be practiced. These embodiments are described in sufficient detail to enable those skilled in the art to practice the invention.

It will be appreciated by those of ordinary skill in the art that any arrangement, which is calculated to achieve the same purpose, may be substituted for the specific embodiment shown. For example, additional layers of patterned conductive materials and interconnects for carrying signals, power, and ground may exist between, above, between, or below the embedded capacitor structures, which are shown in the figures.

The various embodiments have been described in the context of providing excess, off-chip capacitance to a die. One of ordinary skill in the art would understand, based on the description herein, that the method and apparatus of the present invention could also be applied in many other applications where a capacitor having a low inductance, low resistance path to a circuit load is desired. Therefore, all such applications are intended to fall within the spirit and scope of the present invention.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps which have been described and illustrated in order to explain the nature of this invention may be made without departing from the spirit and scope of the invention as expressed in the adjoining claims.

What is claimed is:

1. An electronic circuit housing comprising:
   a first layer having a cavity within which a discrete device is embedded, wherein a non-conductive material is deposited in the cavity over the discrete device, and the first layer is oriented along a horizontal plane; and
   one or more trench vias located in the non-conductive material substantially over the discrete device so that a height of the one or more trench vias extends from a top surface of the first layer to a top surface of the discrete device, and the one or more trench vias make electrical contact with one or more terminals of the discrete device, wherein each of the one or more trench vias is formed from a conductive material, and each of the one or more trench vias has a roughly rectangular shape, in the horizontal plane, with a length that is at least twice a width of each of the one or more trench vias.

2. The electronic circuit housing as claimed in claim 1, further comprising:
   one or more additional layers located above the one or more trench vias, wherein the one or more additional layers include one or more vias that make electrical contact with each of the one or more trench vias.

3. The electronic circuit housing as claimed in claim 2, wherein the one or more additional layers include multiple vias that make electrical contact with each of the one or more trench vias.

4. The electronic circuit housing as claimed in claim 1, wherein the housing is an integrated circuit package, and the one or more trench vias are electrically connectable to a load within an integrated circuit coupled to the integrated circuit package.

5. The electronic circuit housing as claimed in claim 1, wherein the discrete device is a capacitor.

6. The electronic circuit housing as claimed in claim 5, wherein each of the one or more trench vias makes electrical contact with two or more terminals of the capacitor.

7. The electronic circuit housing as claimed in claim 1, wherein the housing is formed from organic materials.

8. The electronic circuit housing as claimed in claim 1, wherein the housing is formed from inorganic materials.

9. The electronic circuit housing as claimed in claim 1, further comprising:
   one or more additional layers within which one or more additional discrete devices are embedded; and
   one or more additional trench vias in electrical contact with one or more terminals of the one or more additional discrete devices.

10. The electronic circuit housing as claimed in claim 1, wherein at least one trench via makes electrical contact with two or more terminals of the discrete device.

11. The electronic circuit housing as claimed in claim 10, wherein the two or more terminals are on opposite sides of the discrete device.

12. The electronic circuit housing as claimed in claim 1, wherein two or more trench vias are oriented in a parallel pattern to each other.

13. An integrated circuit package comprising:
    a first layer having one or more cavities within which one or more capacitors are embedded, wherein a non-conductive material is deposited in the one or more cavities over the one or more capacitors, and the first layer is oriented along a horizontal plane; and
    one or more trench vias located in the non-conductive material substantially over the one or more capacitors so that a height of each trench via extends from a top surface of the first layer to a top surface of a capacitor, and each trench via makes electrical contact with one or more terminals of the one or more capacitors, wherein each of the one or more trench vias is formed from a conductive material, and each of the one or more trench vias has a roughly rectangular shape, in the horizontal plane, with a length that is at least twice a width of each of the one or more trench vias.

14. The integrated circuit package as claimed in claim 13, further comprising:
    one or more additional layers located above the one or more trench vias, wherein the one or more additional layers include one or more vias that make electrical contact with each of the one or more trench vias.

15. The integrated circuit package as claimed in claim 14, wherein the one or more additional layers include multiple vias that make electrical contact with each of the one or more trench vias.

16. The integrated circuit package as claimed in claim 14, further comprising landing pads on the top surface of the integrated circuit package, to which a microprocessor is electrically connected.

17. The integrated circuit package as claimed in claim 13, wherein each of the one or more trench vias makes electrical contact with two or more terminals of a capacitor.

18. The integrated circuit package as claimed in claim 17, wherein the two or more terminals are on opposite sides of the capacitor.

19. The integrated circuit package as claimed in claim 13, wherein two or more trench vias are oriented in a parallel pattern to each other.

20. The integrated circuit package as claimed in claim 13, wherein the package is formed from organic materials.

21. The integrated circuit package as claimed in claim 13, wherein the package is formed from inorganic materials.

22. A method for fabricating an electronic circuit housing, the method comprising:

fabricating one or more layers of the electronic circuit housing, wherein the one or more layers are oriented along a horizontal plane, embedding one or more discrete devices within one or more cavities in at least one of the one or more layers, wherein a non-conductive material is deposited in each cavity over each discrete device, and forming one or more trench vias in the non-conductive material substantially over the one or more discrete devices so that a height of each trench via extends from a top surface of the at least one of the one or more layers to a top surface of at least one of the discrete devices, and each trench via makes electrical contact with one or more terminals of the discrete devices, wherein each of the one or more trench vias is formed from a conductive material, and each of the one or more trench vias has a roughly rectangular shape, in the horizontal plane, with a length that is at least twice a width of each of the one or more trench vias.

23. The method as claimed in claim 22, wherein forming the one or more trench vias comprises:

drilling openings in material above the one or more discrete devices; and depositing conductive material in the openings.

24. The method as claimed in claim 22, further comprising:

forming one or more additional layers above the one or more trench vias; and forming one or more conventional vias in the additional layers, wherein the one or more conventional vias make electrical contact with the one or more trench vias.

25. The method as claimed in claim 24, wherein forming the one or more conventional vias comprises forming multiple conventional vias in electrical contact with the one or more trench vias.

26. The method as claimed in claim 22, wherein the electronic circuit housing is an integrated circuit package, the method further comprising electrically connecting an integrated circuit to the integrated circuit package.

27. A computer system comprising:

a bus;

a memory coupled to the bus;

an integrated circuit package coupled to the bus, including:

a first layer having one or more cavities within which one or more capacitors are embedded, wherein a non-conductive material is deposited in the one or more cavities over the one or more capacitors and the first layer is oriented along a horizontal plane and one or more trench vias located in the non-conductive material substantially over the one or more capacitors so that a height of each trench via extends from a top surface of the first layer to a top surface of a capacitor, and each trench via makes electrical contact with one or more terminals of the one or more capacitors, wherein each of the one or more trench vias is formed from a conductive material, and each of the one or more trench vias has a roughly rectangular shape, in the horizontal plane, with a length that is at least twice a width of each of the one or more trench vias; and a microprocessor located on a top surface of the package, the microprocessor containing a circuit which is electrically connected to the one or more trench vias.

28. The computer system as claimed in claim 27, wherein the integrated circuit package further includes one or more additional layers located above the one or more trench vias, wherein the one or more additional layers include one or more vias that make electrical contact with each of the one or more trench vias.

29. The computer system as claimed in claim 28, wherein the one or more additional layers include multiple vias that make electrical contact with each of the one or more trench vias.

* * * * *